United States Patent [19]
Gale et al.

[11] Patent Number: 4,812,747
[45] Date of Patent: Mar. 14, 1989

[54] TRANSDUCER LINEARIZING SYSTEM

[75] Inventors: Allan R. Gale, Allen Park; Lyle O. Hoppie, Birmingham, both of Mich.

[73] Assignee: Eaton Corporation, Cleveland, Ohio

[21] Appl. No.: 103,775

[22] Filed: Sep. 30, 1987

Related U.S. Application Data

[63] Continuation of Ser. No. 783,512, Oct. 3, 1985, abandoned.

[51] Int. Cl.⁴ .................... G01R 15/10; G06F 15/353
[52] U.S. Cl. ...................................... 324/132; 364/573
[58] Field of Search .................. 324/132; 364/573; 328/142; 307/490, 491

[56] References Cited

U.S. PATENT DOCUMENTS

| 4,064,396 | 12/1977 | Panarello | 364/573 |
| 4,282,578 | 8/1981 | Payne et al. | 364/573 |
| 4,349,886 | 9/1982 | Ibar | 324/132 |
| 4,516,008 | 5/1985 | Jones | 324/132 |

FOREIGN PATENT DOCUMENTS

| 2710857 | 10/1978 | Fed. Rep. of Germany | 324/132 |
| 0042058 | 4/1977 | Japan | 364/573 |
| 0029762 | 3/1980 | Japan | 364/573 |
| 0029763 | 3/1980 | Japan | 364/573 |
| 0029764 | 3/1980 | Japan | 364/573 |

Primary Examiner—Ernest F. Karlsen
Attorney, Agent, or Firm—J. G. Lewis

[57] ABSTRACT

A system (20) for linearizing a non-linear transducer output signal ($s_2$) which may be amplified to a non-linear output signal ($s_2$) by suitable amplifier means (2) by providing signal ($s_2$) to both a summing or linearization means (6) and an analog to digital converter which provides a signal ($s_3$) to a storage means (4) which selectively provides a predetermined correction signal ($s_4$) which is received by a digital to analog converter (5) to provide a signal ($s_5$) to linearization means (6) for combination with signal ($s_2$) to provide a linearized output signal ($s_6$).

2 Claims, 1 Drawing Sheet

TRANSDUCER LINEARIZING SYSTEM

This application is a continuation of application Ser. No. 783,512, filed Oct. 3, 1985, now abandoned.

INTRODUCTION

The present invention relates generally to a system for linearizing an electrical output signal of a non-linear transducer over a prescribed range and more particularly where the system includes storage means from which a predetermined correction signal is selected and applied to the non-linear signal to provide a linearized electrical transducer signal over the prescribed range.

BACKGROUND OF THE INVENTION

Broadly, transducers employing sensor members have been used for many years to provide an electrical voltage signal depicting changes in a variable of interest being monitored by the transducer over a prescribed range. More particularly, transducers employing sensor members such as strain gages have been used for many years to monitor stresses arising in objects from various forces imposed thereupon. Generally, such transducers are operative to provide an electrical signal which lies within a predetermined range that by various means can be converted into information concerning the nature of the force causing the signal to occur when the force lies within a prescribed range.

Although it is highly desirable that such transducers provide a linearized output signal proportional to the force being imposed upon the object over a prescribed range, such is not always the case since many transducers, particularly transducers employing one or more strain gages, for one reason or another, provide a non-linear output signal profile over a prescribed range of forces imposed upon the object which interferes with the accuracy of measurement as well as causing considerable cost and expense in replacing such non-linear sensor member with one predetermined to provide a linear output signal over the prescribed range or having to modify or repair such non-linear transducer so that it provides a linearized output signal profile over the prescribed range.

Systems heretofore used for linearizing non-linear transducer signals however have generally employed complex and expensive hardware provided with large memory units containing large amounts of stored information required to linearize the non-linear signal as an entire entity in order to provide a linear signal over a prescribed range.

In view of the above, a need exists to provide a simple and economical system for linearizing an electrical non-linear transducer output signal for improving the accuracy over a prescribed range as well as eliminating the cost and expense of having to either replace or modify or repair such non-linear transducers to provide a transducer capable of providing a linear output signal over the prescribed range.

SUMMARY OF THE INVENTION

Accordingly, it is an object of this invention to provide a system for linearizing an electrical non-linear transducer output signal profile to provide a linear profile thereof over a prescribed range.

It is another object of this invention to provide an economical and effective system for linearizing an electrical non-linear transducer signal to provide a linear profile thereof over a prescribed range.

DESCRIPTION OF SOME PREFERRED EMBODIMENTS

Figure 1:
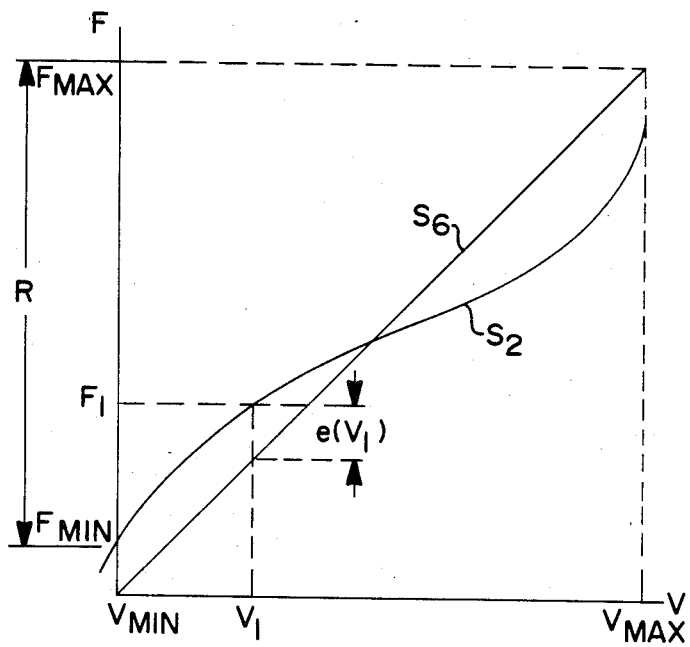
FIG. 1 shows a graph of force "F" lying in the range "R" versus output signal voltage "V" for both non-linear output signal, $s_2$, and a desired linearized output signal, $s_6$.

FIG. 1 shows a graph of a non-linear transducer output signal profile $s_2$ over a prescribed range "R" of forces "F" where output signal $s_2$, in the case of FIG. 1, is an electrical voltage output signal "V" produced, for example, by a strain gage or wheatstone bridge transducer including one or more strain gages secured to an object upon which is imposed a force lying in the range "R". The prescribed range "R" of forces lies between the minimum and maximum values labeled $F_{min}$ and $F_{max}$ respectively, and respectively give rise to output signal voltages lying between $V_{min}$ and $V_{max}$.

Although signal $s_2$ increases with increasing force F between $V_{min}$ and $V_{max}$, its profile over range "R" is non-linear. The non-linearity arises from the non-linear signal output characteristics of the particular strain gage transducer and/or wheatstone transducer bridge arrangement employing one or more of such non-linear strain gages being used in the application or in some cases, to non-linearity introduced by the substrates to which the strain gages are secured.

In the above example, the term "transducer" refers to a device which is responsive to an externally applied force to produce an electrical voltage output signal. It should be understood that the present invention can also be applied to linearize the electrical voltage output signal of a transducer which is responsive to a variable other than force. For example, the electrical voltage output signal of a transducer which is responsive to displacement, velocity, acceleration, temperature, pressure, magnetic field strength, or other such variables, can be linearized by the technique of the present invention.

In FIG. 1, output signal $s_6$ is a desired straight line profile signal for which the variable is a force "F" lying in the range "R" that is related to an output voltage "V" lying between $V_{min}$ and $V_{max}$ by the linear relationship:

$$F = \frac{F_{max} - F_{min}}{V_{max} - V_{min}} (V - V_{min}) + F_{min}. \tag{1}$$

The manner in which corrections to the non-linear profile $s_2$ are made to produce the desired linear profile $s_6$ according to this invention can be understood by considering a force, $F_1$, which gives to the non-linear voltage, $V_1$, according to profile s as shown in FIG. 1. It can be seen in FIG. 1 that $F_1$ can be mathematically expressed as:

$$F_1 = \left[ \frac{F_{max} - F_{min}}{V_{max} - V_{min}} (V_1 - V_{min}) + F_{min} \right] + e(V_1). \quad (2)$$

Comparing equation (2) with equation (1), it is seen that the term in brackets is the force that would correspond to voltage $V_1$ if the transducer were linear, and it is seen that $e(V_1)$ is the error between the non-linear and the linear profiles for that value $V_1$ of output voltage V, or otherwise stated, is the difference between the force necessary to cause the actual non-linear transducer to provide a signal of value $V_1$ and the force of the desired linearized profile at the same signal value $V_1$. Equation (2) can be re-written as:

$$V_1 = V_{min} + \frac{V_{max} - V_{min}}{F_{max} - F_{min}} [F_1 - F_{min} - e(V_1)] \quad (3)$$

and it should now be obvious to those skilled in the art that since $V_1$ is known, the value:

$$\frac{V_{max} - V_{min}}{F_{max} - F_{min}} e(V_1)$$

can be determined either by calculation or by using the value $V_1$ to address a storage register containing the entire quantity:

$$\frac{V_{max} - V_{min}}{F_{max} - F_{min}} e(V_1)$$

or, at least the quantity $e(V_1)$ to which the quantity:

$$\frac{V_{max} - V_{min}}{F_{max} - F_{min}}$$

may be subsequently applied by conventional multiplication means. If this value is subsequently added to $V_1$, it can be seen from equation (3) that a new value, $V_1'$ given by $$V_1' = V_1 + \frac{V_{max} - V_{min}}{F_{max} - F_{min}} e(V_1) = \quad (4)$$

$$V_{min} + \frac{V_{max} - V_{min}}{F_{max} - F_{min}} (F_1 - F_{min})$$

which relates force, $F_1$, to the output voltage, $V_1'$, in a linear manner. The concept of utilizing predetermined correction quantities at selected locations along signal $S_2$ within range "R" of forces "F" provides a means substantially reducing the complexity and information storage capacity heretofore required for linearizing a non-linear electrical signal.

Commonly, the correction quantity described above is two percent (2%) or less and more commonly one percent (1%) or less of the value of the non-linear signal $S_2$ at any point within the range "R" which may, for example, range from zero to 1000 pounds of force. Since the correction quantity is commonly two hundredths or less of the value of the non-linear signal, a substantially lesser amount of stored information is required for subsequent signal correction than is required in the conventional technique of storing the entire signal and its correction, if the same output signal resolution is to be maintained.

For example, since the profile or curve of signal $S_2$ over range "R" may for example be described by a 5th or 6th order function, a series expansion analysis such as a Fourier or Taylor series expansion analysis well known to those skilled in the art can be employed using a limited number of non-linear signal data points to provide a highly accurate derived mathematical relationship between force "F" and voltage "V" over range "R" to provide a smooth curve or profile of signal $S_2$ best fitting the data. Once determined, the correction quantities for linearizing the selected locations can be determined and the derived mathematical equation of the profile of curve or profile $S_2$ can itself be used to calculate a desired number of correction quantities for locations intermediate the five or six locations originally selected. It has been found that linearization according to the above described procedure is highly effective where approximately 128 predetermined correction quantities are applied to signal $S_2$ over a range R of forces from 0 to 1000 pounds.

The use of correction quantity data capable of linearizing a complex non-linear curve over a prescribed range "R" illustratively reduces the required linearization correction data for a 5th or 6th order equation to about 128 pieces enabling, for example, one to retrievably store such information in an inexpensive eight bit storage means such as a read-only-memory (ROM) or erasable read-only-memory (EROM) storage means hereinafter referred to in FIGS. 2 and 3 rather than the larger and substantially more expensive storage means such as a 16 bit type storage means heretofore used.

It can readily be seen that, depending on the nature of asymmetry of output signal $s_2$ between $V_{min}$ and $V_{max}$, either or both positive and negative voltage corrections to output voltage V can readily be determined between volta $V_{min}$ and $V_{max}$ for linearizing the output signal $s_2$ profile. The voltage corrections can be predetermined by first determining the equation best representing signal $s_2$ data known within the prescribed range "R" by known mathematical procedures such as Fourier series expansion and then plotting the profile or curve of signal $s_2$ over the prescribed range "R" from the derived equation and then determining the particular value difference between the profile of signal $s_2$ and a desired straight line fitted to the profile of signal $s_2$ and then using the derived equation to determine the value difference for a selected number of intermediate locations along the signal $s_2$ profile within prescribed region R to provide the linearized signal $s_6$ profile proportionality desired. A preferred system by which the predetermined set of voltage corrections is used to convert non-linear output signal profile $s_2$ to the linearized signal profile $s_6$ between $V_{min}$ and $V_{max}$ over range "R" of forces imposed upon the object is hereinafter more fully described with respect to system 20 of FIG. 2.

Figure 2:
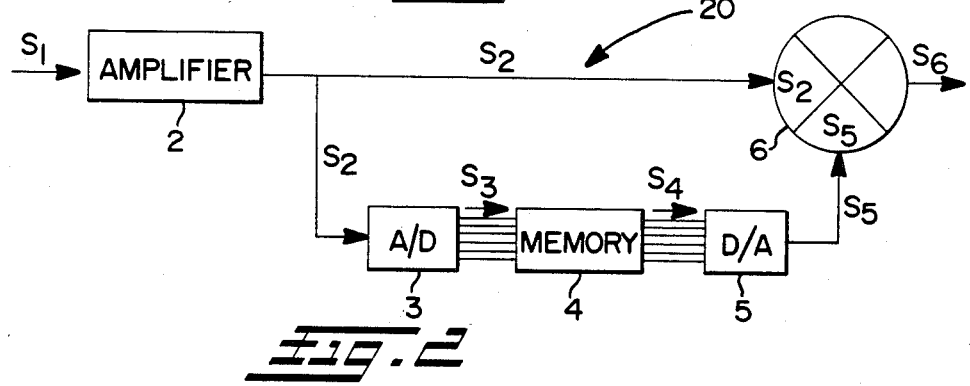
FIG. 2 shows a block diagram of a system 20 operable to linearize an amplified intermediate output signal, $s_2$, of a non-linear transducer over a prescribed range.

In FIG. 2, the actual output signal $s_1$ of the non-linear transducer secured to the object is received by amplifier 2 of system 20. Although shown as a part of systems 20 and 40 of FIGS. 2 and 3, amplifier 2 need not be included in applications where the transducer output signal is large enough to preclude the need to amplify the signal. In the event an amplifier is not included in the linearization system of the invention, then the references used to denote the various signals in FIGS. 2 and 3 can be adjusted accordingly. Signal $s_1$ is generally an analog signal which is received by amplifier 2 to provide magnified intermediate analog output signal $s_2$ shown in FIG. 1.

Magnified analog signal $s_2$ is delivered both to a suitable analog to digital converter 3 and to a summing or linearization means 6 of system 20. Converter 3 converts analog signal $s_2$ to provide a corresponding binary coded digital output signal $s_3$ by means well known to those skilled in the art of analog to digital converters.

Digital signal $s_3$ is delivered to storage means 4 of system 20 which may be any suitable means of storing retrievable electrical data such as a read-only memory storage means (ROM) or erasable read-only memory storage means (EROM) well known to those skilled in the art.

Storage means 4 has previously been supplied with the previously described set of correction quantities in digital form to be made for particular values of intermediate signal $s_2$ in order to linearize the value to provide linearized signal $s_6$. Intermediate signal $s_3$ is used as an address for storage means 4 to access the correction quantity corresponding thereto.

A digital output correction signal $s_4$ is thus provided by storage means 4 for a particular digital input signal $s_3$. Signal $s_4$ is received by a suitable digital to analog signal converter 5 of system 20 well known to those skilled in the art which in turn provides analog correction signal s which is received by linearizer or summing device 6 of system 20. Linearizer 6 generally adds signal $s_2$ and the corresponding correction quantity $s_5$ together where correction quantity $s_5$ may be either a positive or a negative value as previously described and accordingly provides linearized output signal $s_6$ shown in FIG. 1.

Figure 3:
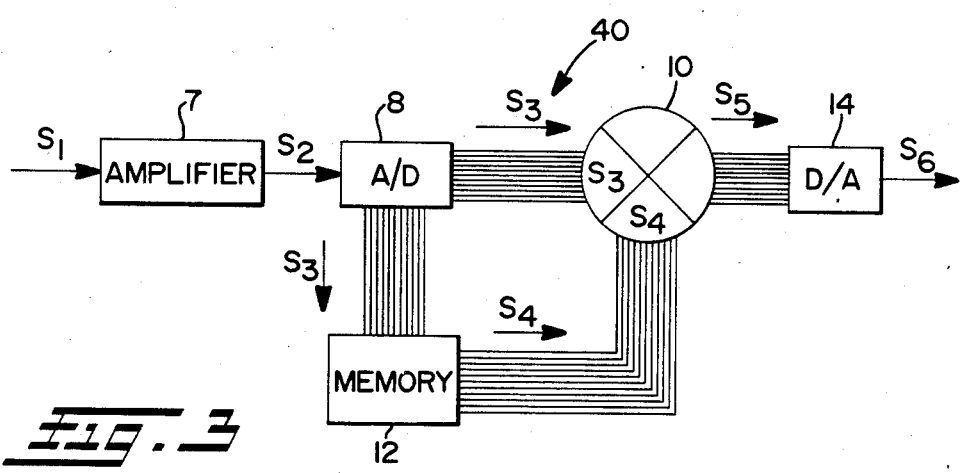
FIG. 3 shows a system 40 adapted to provide linearized output signal $s_6$ from an amplified non-linear intermediate signal $s_2$ of a non-linear transducer monitoring the effect of forces "F" lying in the range "R".

System 40 of FIG. 3 illustrates another system by which to linearize an amplified non-linear output signal $s_2$ to a linearized output signal $s_6$ to provide a linearized profile of signal $s_6$ over range "R" of forces "F" imposed upon an object where the non-linear amplified output signal $s_1$ of the strain gage and/or the wheatstone bridge range from $V_{min}$ to $V_{max}$ for illustrative purposes.

In system 40, non-linear analog signal $s_1$ is received and amplified into intermediate analog signal $s_2$ by amplifier 7. Signal $s_2$ is received and converted into a digital signal $s_3$, preferably a binary coded digital signal, by analog to digital converter 8. Although shown separately, converter 8 may of course be a part of amplifier 7.

Digital signal $s_3$ is delivered both to linearizer or summing device 10 and to storage means 12. Storage means 12 contains the predetermined set of correction quantities in digital form to be applied to digital signal $s_3$ to linearize signal $s_2$ to signal $s_6$ according to the particular value of $s_3$ received by storage means converter 12.

Storage means 12 delivers an output digital correction signal $s_4$ to linearizer 10. Linearizer 10 adds digital correction signal $s_4$ to digital signal $s_3$ (where signal $s_4$ may be either negative or positive as previously described). In turn, linearizer 10 correspondly provides a digital output signal $s_5$ representing the combination of digital signal s and digital correction signal $s_4$, which can be used directly or, $s_5$ can be received by digital to analog converter 14, which in turn provides analog output signal $s_6$ in response where analog signal $s_6$ provides a linearized profile of voltage versus force over the prescribed range "R" of forces "F" covering a voltage range of $V_{min}$ to $V_{max}$.

It can readily be seen that the system of the invention provides a useful means of providing a linear voltage profile which is proportional to a variable such as a force being imposed upon an object over a prescribed range "R" by selectively applying from a set of retrievably stored correction quantities, corresponding correction quantities predetermined to provide the linear signal profile.

What is claimed is:

1. Within an apparatus employing a single memory device, a method of effecting a high resolution linearization of an analog input voltage signal having a characteristic profile over a predetermined voltage range, said profile varying from an idealized profile by an error component, said error component equaling the arithmetic difference between the input and idealized profiles at finite points within said range, said method comprising:

digitizing said input signal;

addressing predetermined correction quantity data within said single memory device with said digitized input signal, said data comprising a finite number of constants, each constant correlating with an error component;

outputting said addressed constant as a digital error signal;

converting said digitized error signal to an equivalent analog error signal;

arithmetically adding said analog error signal with said input voltage signal in a summing junction; and outputting the resultant sum of said analog error and input voltage signals as an approximation of said idealized profile.

2. The method of claim 1, further comprising the step of amplifying said analog signal prior to digitization.

* * * * *